(12) United States Patent
Endo

(10) Patent No.: US 6,872,418 B2
(45) Date of Patent: Mar. 29, 2005

(54) FILM FORMING METHOD

(75) Inventor: Hiroki Endo, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 112 days.

(21) Appl. No.: 10/255,177

(22) Filed: Sep. 25, 2002

(65) Prior Publication Data

US 2003/0059533 A1 Mar. 27, 2003

(30) Foreign Application Priority Data

Sep. 25, 2001 (JP) ........................................ 2001-292465

(51) Int. Cl.$^7$ ................................................ B05D 3/12
(52) U.S. Cl. .................... 427/96; 427/240; 427/261; 427/265; 427/350; 427/377; 427/397.7; 427/419.2; 427/425; 118/52; 118/320; 438/778; 438/782
(58) Field of Search ................................ 427/240, 425, 427/350, 261, 265, 96, 97, 377, 385.5, 419.2, 419.7, 397.7; 118/52, 320; 438/778, 782

(56) References Cited

U.S. PATENT DOCUMENTS

| | | | | |
|---|---|---|---|---|
| 5,312,512 A | * | 5/1994 | Allman et al. ............... | 438/624 |
| 5,453,406 A | * | 9/1995 | Chen .......................... | 438/763 |
| 5,554,567 A | * | 9/1996 | Wang .......................... | 438/624 |
| 5,707,687 A | * | 1/1998 | Ueda et al. ................. | 427/240 |
| 5,985,363 A | * | 11/1999 | Shiau et al. ................ | 427/240 |
| 6,214,104 B1 | * | 4/2001 | Iida et al. ............... | 106/287.13 |
| 6,277,441 B1 | | 8/2001 | Endo et al. | |
| 6,313,044 B1 | * | 11/2001 | Lee ............................. | 438/758 |

FOREIGN PATENT DOCUMENTS

| JP | 3-30453 A | * | 2/1991 |
|---|---|---|---|
| JP | 07-227568 | | 8/1995 |

* cited by examiner

*Primary Examiner*—Kirsten Jolley
(74) *Attorney, Agent, or Firm*—Carrier, Blackman & Associates, P.C.; Joseph P. Carrier; William D. Blackman

(57) ABSTRACT

A method for forming a film using a rotating cup application apparatus in which a rotatable inner cup is provided within an outer cup, the upper openings of the inner cup and the outer cup are closed with corresponding lids, and the lid for the inner cup is integrally rotated together with the inner cup, the method comprising the steps of setting a material to be treated, on which wiring layers have been formed, in the rotating cup application apparatus, applying SOG onto the surface of the material to be treated, thereafter closing the upper openings of the inner cup and the outer cup with the lids, rotating the inner cup in this state to thereby uniformly diffusing the SOG, repeating the SOG application and diffusing steps, and thereafter baking the material to be treated in a heat treatment apparatus.

10 Claims, 2 Drawing Sheets

FILM FORMING METHOD

BACKGROUND OF THE INVENTION

1. Field of the Invention

The present invention relates to a method for forming a film such as an interlayer insulating film provided between layers of polysilicon or metal having a high melting point, or an interlayer insulating film provided between wiring layers of aluminum.

2. Description of Background Art

Conventionally, for forming an interlayer insulating film on a material to be treated, a CVD method has been used. However, as requirements for reducing the space between wiring layers on a material to be treated are increasing, it becomes difficult to form a sufficient film by using a CVD method. Specifically, since a film formed by a CVD method has a conformal shape, it is not possible to sufficiently fill the small space between wiring layers.

Then, the formation of a SOG coating film on a material to be treated has been examined. However, in a case of forming a SOG coating film using a common open-type cup, a roughness-density difference in film quality occurs between the SOG coating film formed at the bottom of a space portion of a line-and-space pattern portion and the SOG coating film formed in the other portion. Generally speaking, a SOG coating film formed at the bottom of a space portion of a line-and-space pattern portion is rough, while a SOG coating film formed in the other portion is dense.

In this regard, the roughness-density difference refers to a phenomenon that the same SOG coating film has a different density depending upon the portion where the SOG coating film is applied. For example, when the dense portion has a density of 100, the rough portion has a density of 50.

In particular, if the aspect ratio of the space between the wiring layers is high, such a phenomenon of a roughness-density difference gets worse. If the aspect ratio is low, such a phenomenon rarely occurs.

In a case of using a common cup (open-type), it is common that a film is formed by applying SOG only once, even to a high aspect ratio portion. Therefore, it is difficult to solve the problem of a roughness-density difference.

To solve the above problem, in Japanese Unexamined Patent Application Publication No. Hei 7-227568 (corresponding to U.S. Pat. No. 6,277,441 B1), the present inventor has disclosed that a material to be treated is rotated in two stages to apply SOG in which the time interval between the first rotation and the second rotation is made 10 times longer than the time of the first rotation. However, this method cannot overcome the problem of a roughness-density difference. The high aspect ratio portion becomes rough as shown in FIG. 4.

The above-mentioned phenomenon of a roughness-density difference deteriorates reliability of a device due to the rough portion. Specifically, it is fatal to a gate electrode which is the heart of a semiconductor device. In the rough portion, the coating film has fine voids therein. Therefore, when heating (baking) is conducted in a subsequent process after applying SOG, gas in the voids expands, thereby causing cracks to occur in the SOG coating film. In that case, thee SOG coating film cannot function as a SOG insulating film.

Consequently, an object of the present invention is to provide a method for forming an interlayer coating film which is uniform even in a fine space of 0.13 $\mu$m or less between wiring layers by reducing an area of a rough portion and a dense portion, and reducing a roughness-density difference.

SUMMARY OF THE INVENTION

According to the present invention, for the purpose of overcoming the problem mentioned above, there is provided a method for forming a film using a rotating cup application apparatus in which a rotatable inner cup is provided within an outer cup, the upper openings of the inner cup and the outer cup are closed with corresponding lids, and the lid for the inner cup is integrally rotated together with the inner cup, and comprising the steps of (a) setting a material to be treated, on which wiring layers have been formed, in the rotating cup application apparatus, (b) applying SOG onto the surface of the material to be treated, (c) thereafter closing the upper openings of the inner cup and the outer cup with the lids, (d) rotating the inner cup in this state to thereby uniformly diffuse the SOG, repeating the steps (b)–(d), and thereafter baking the material to be treated, to which the SOG has been applied, in a heat treatment apparatus.

In a case of applying SOG using a rotating cup application apparatus, the inside of the rotating cup in a sealed state becomes slightly depressurized during rotation. In this state, a coating solution for forming SOG can be maintained in a solution state and the surface of the SOG coating film can be kept from being dried during the application. As a result, the SOG can enter the fine space between the wiring layers without losing its flowability. In summary, by maintaining the depressurized state and the flowability of the SOG, it is possible to semi-forcedly fill the space between the wiring layers with the SOG, and thereby it is possible to reduce the roughness-density difference in the SOG coating film.

In addition, by repeatedly conducting the SOG application steps (preferably 2 or 3 times) to obtain a predetermined SOG coating film, it is possible to reduce the roughness-density difference even in the space between the wiring layers having a high aspect ratio of 2 or more. Specifically, the thickness of SOG is made thin and formation of a roughness-density region (the area of a rough portion and a dense portion) is minimized in the first application. With this, the aspect ratio is substantially reduced before the next application, and thereby the roughness-density region and the roughness-density difference can be reduced.

With regard to the rate of the rotation during the application, the rotation is conducted at a high rate (preferably 3000–5000 rpm) and for a short period of time (preferably 1 second) rather than at a low rate and for a long period of time. With this, it is possible to further reduce the roughness-density difference.

As the baking conditions, the baking temperature is 400–1000° C., the baking time is 30–90 minutes, and the inside of the heat treatment apparatus is allowed to be in a state of excess oxygen. With this, it is possible to accelerate the reaction of SOG with oxygen and thereby obtain a uniform SOG coating film having a reduced roughness-density difference.

DETAILED DESCRIPTION OF PREFERRED EMBODIMENT(S)

Hereinafter, embodiments according to the present invention will be explained with reference to the attached drawings.

Figure 1:
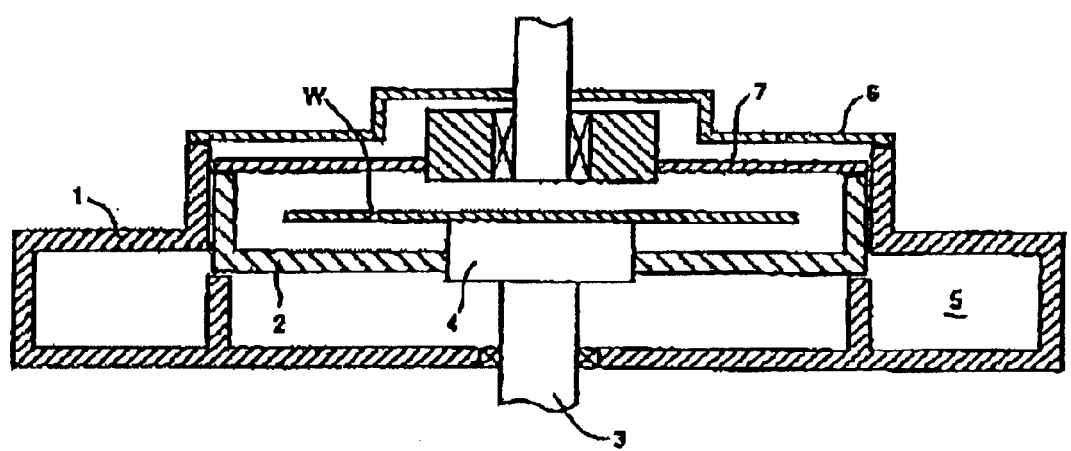
FIG. 1 is a cross-sectional view of a rotating cup application apparatus used in the present invention.

As shown in FIG. 1, in a rotating cup application apparatus used in the present invention, an inner cup 2, which is provided in an annular outer cup 1, is fixed to the axis of a spinner 3 and rotated with this spinner 3 at a high rate. At the upper end of the axis of the spinner 3, a vacuum chuck 4 is provided for attracting and fixing a substrate W such as a semiconductor wafer or the like. Also, in the outer cup 1, a withdrawal passage 5 is formed for receiving drainage from the inner cup 2.

Figure 2:
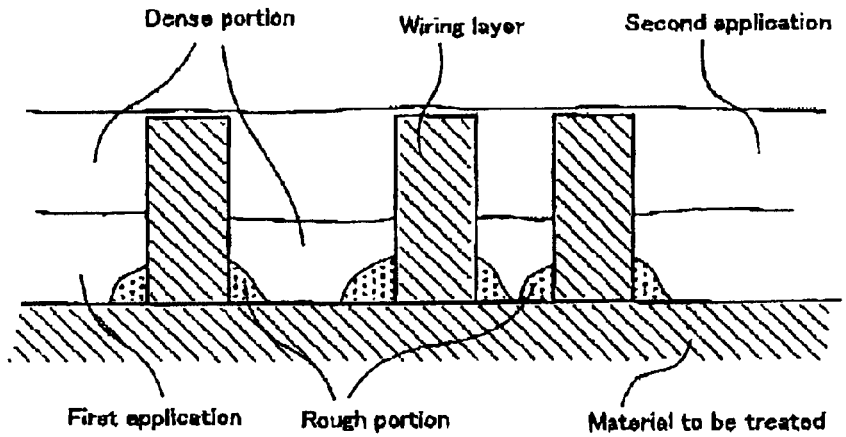
FIG. 2 is a cross-sectional view of a material to be treated to which SOG has been applied two times using the rotating cup according to the present invention.
Figure 3:
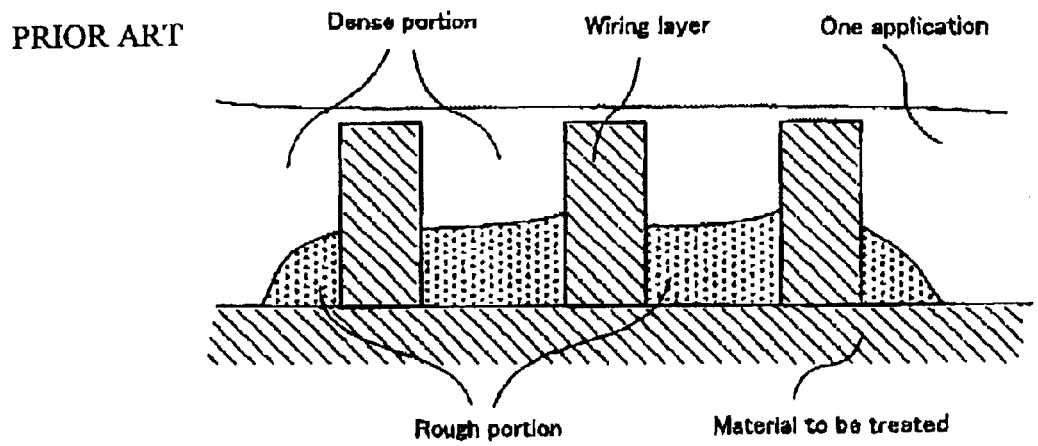
FIG. 3 is a cross-sectional view of a material to be treated to which SOG has been applied once using a common cup according to the prior art.
Figure 4:
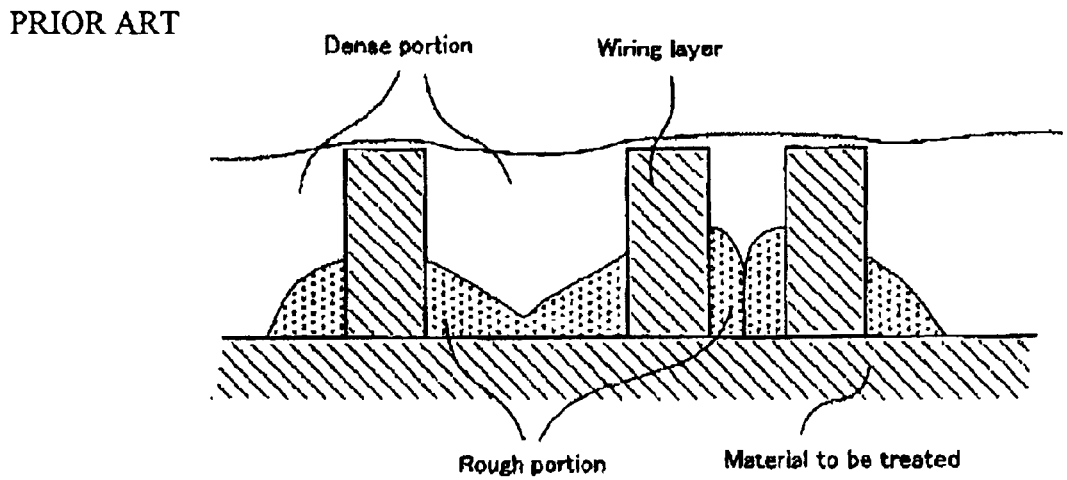
FIG. 4 is a cross-sectional view showing a roughness-density difference depending upon the difference in the aspect ratio of the space between the wiring layers.

FIG. 2 is a cross-sectional view of a material to be treated to which SOG has been applied two times using the rotating cup application apparatus shown in FIG, 1. As shown in FIG. 2, the thickness of the first SOG application is controlled to be less than half of the thickness in the case of only one application using a common open type cup, and thereby the formed roughness-density region is reduced. Next, the thickness of the SOG coating film is adjusted to be a predetermined value through the second SOG application. Consequently, the rough portion is considerably reduced.

Next, the material to be treated having SOG applied thereto is transferred to an adjacent heat treatment apparatus and a heat treatment is conducted successively. As the heat treatment apparatus, there are two types, that is, a batch type and a single-wafer type. A plurality of materials can be treated at one time in the batch type, while each material is treated individually in the single-wafer type.

In the single-wafer type heat treatment apparatus, a material to be treated is put on a plate-like heating apparatus. In this instance, since only the plate is a heat source, the temperature distribution within the treatment chamber becomes uneven and it is difficult to conduct a uniform treatment. On the contrary, in the batch type apparatus, since a heat source is provided around the apparatus, it is possible to heat the inside of the treatment chamber uniformly by radiation heat. In addition, it is possible to make the temperature even between each material to be treated by heating for 30 minutes.

As the baking conditions in the heat treatment apparatus, the baking temperature is 400–1000° C. and the baking time is 30–90 minutes in the state where radiation heat can be obtained. Also, when a SOG solution undergoes a heat treatment in a state of an excess oxygen level as compared to the atmosphere by feeding oxygen gas or steam into the heat treatment apparatus, a dehydration condensation reaction occurs in the SOG solution, $H_2O$ is evaporated, and densified $SiO_2$ is left as a film.

The SOG solution is more and more activated by increasing the temperature, and becomes easy to combine with $O_2$. Thus, the reaction is accelerated and the densification is increased under higher temperature conditions. However, increasing the temperature too much causes damage to the wiring. In this regard, a state of excess oxygen refers to a state where the amount of oxygen in the heat treatment chamber is greater than that of the atmosphere (at least 21%).

As is explained in the above, according to the present invention, by applying SOG onto a material to be treated a couple of times at a high rotation rate using a rotating cup application apparatus, it is possible to minimize the roughness-density difference of an insulating film even in the space between the wiring layers having a high aspect ratio. Also, by baking the material to be treated using a batch type heat treatment apparatus in the conditions where the baking temperature is 400–1000° C., the baking time is 30–90 minutes, and the inside of the apparatus is allowed to be in a state of excess oxygen, it is possible to obtain a densified and flattened film having a reduced roughness-density difference.

Although there have been described what are the present embodiments of the invention, it will be understood by persons skilled in the art that variations and modifications may be made thereto without departing from the gist, spirit or essence of the invention. The scope of the invention is indicated by the appended claims.

What is claimed is:

1. A method for forming a film using a rotating cup application apparatus in which a rotatable inner cup is provided within an outer cup, upper openings of said inner cup and said outer cup are closed with corresponding lids, and said lid for the inner cup is integrally rotated together with said inner cup, the method consisting essentially of the steps of:

(a) setting a material to be treated in said rotating cup application apparatus, a surface of said material having irregularities thereon;

(b) applying SOG onto the surface of said material to be treated;

(c) closing the upper openings of said inner cup and said outer cup with the lids;

(d) rotating said inner cup at a rate of 3000–5000 rpm in this state to uniformly diffuse said SOG while maintaining said SOG in a solution state;

repeating the steps (b)–(d); and (e) thereafter baking said material to be treated, to which the SOG has been applied, in a heat treatment apparatus.

2. The method for forming a film according to claim 1, wherein said irregularities comprise wiring layers.

3. The method for forming a film according to claim 1, wherein an aspect ratio of a space between said irregularities is 2 or more.

4. The method for forming a film according to claim 1, wherein said step (e) involves a baking temperature of 400–1000° C., a baking time of 30–90 minutes, and an oxygen level inside of said heat treatment apparatus is in excess of atmospheric oxygen level.

5. The method for forming a film according to claim 1, wherein said steps (b)–(d) are repeated 2 or 3 times prior to said step (e).

6. A method for forming a film using a rotating cup application apparatus in which a rotatable inner cup is provided within an outer cup, upper openings of said inner cup and said outer cup are closed with corresponding lids, and said lid for the inner cup is integrally rotated together with said inner cup, the method consisting essentially of the steps of:

(a) setting a material to be treated, on which wiring layers have been formed, in said rotating cup application apparatus;

(b) applying SOG onto the surface of said material to be treated;

(c) closing the upper openings of said inner cup and said outer cup with the lids;

(d) rotating said inner cup at a rate of 3000–5000 rpm to uniformly diffuse said SOG while maintaining said SOG in a solution state; repeating the steps (b)–(d); and (e) thereafter baking said material to be treated, to which the SOG has been applied, in a heat treatment apparatus.

7. The method for forming a film according to claim 6, wherein an aspect ratio of the space between said wiring layers formed on said material to be treated is 2 or more.

8. The method for forming a film according to claim 6, wherein said step (e) involves a baking temperature of 400–1000° C., a baking time of 30–90 minutes, and an oxygen level inside of said heat treatment apparatus is in excess of atmospheric oxygen level.

9. The method for forming a film according to claim 7, wherein said step (e) involves a baking temperature of 400–1000° C., a baking time of 30–90 minutes, and an oxygen level inside of said heat treatment apparatus is in excess of atmospheric oxygen level.

10. The method for forming a film according to claim 6, wherein said steps (b)–(d) are repeated 2 or 3 times prior to said step (e).

* * * * *